US009043674B2

(12) United States Patent
Wu et al.

(10) Patent No.: US 9,043,674 B2
(45) Date of Patent: May 26, 2015

(54) ERROR DETECTION AND CORRECTION APPARATUS AND METHOD

(71) Applicant: Intel Corporation, Santa Clara, CA (US)

(72) Inventors: Wei Wu, Portland, OR (US); Shih-Lien L. Lu, Portland, OR (US); Rajat Agarwal, Beaverton, OR (US); Henry Stracovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 80 days.

(21) Appl. No.: 13/727,561

(22) Filed: Dec. 26, 2012

(65) Prior Publication Data
US 2014/0181618 A1    Jun. 26, 2014

(51) Int. Cl.
*H03M 13/00* (2006.01)
*H03M 13/15* (2006.01)
*H03M 13/03* (2006.01)
*H03M 13/11* (2006.01)
*H03M 13/37* (2006.01)

(52) U.S. Cl.
CPC .......... *H03M 13/151* (2013.01); *H03M 13/036* (2013.01); *H03M 13/11* (2013.01); *H03M 13/152* (2013.01); *H03M 13/373* (2013.01); *H03M 13/616* (2013.01)

(58) Field of Classification Search
USPC ................................. 714/785, 761
See application file for complete search history.

(56) References Cited

U.S. PATENT DOCUMENTS

| | | | | |
|---|---|---|---|---|
| 4,764,927 A | * | 8/1988 | Izumita et al. | 714/761 |
| 6,532,565 B1 | * | 3/2003 | Roth et al. | 714/761 |
| 7,788,570 B1 | * | 8/2010 | Feng | 714/784 |
| 2002/0041647 A1 | * | 4/2002 | Lin et al. | 375/354 |
| 2002/0166090 A1 | * | 11/2002 | Maeda et al. | 714/746 |
| 2004/0250196 A1 | * | 12/2004 | Hassner et al. | 714/788 |
| 2005/0154966 A1 | * | 7/2005 | Blaum | 714/785 |
| 2008/0320368 A1 | * | 12/2008 | Izumita et al. | 714/763 |
| 2009/0044076 A1 | * | 2/2009 | Sugahara | 714/764 |
| 2009/0063934 A1 | * | 3/2009 | Jo | 714/764 |

(Continued)

FOREIGN PATENT DOCUMENTS

KR    10-2010-0129068 A    12/2010

OTHER PUBLICATIONS

Title: A Low Power Error Detection in the Syndrome Calculator Block for Reed-Solomon Codes; Author: Richard Huynh, Ge Ning, Yang Huazhong; Publisher: IEEE, Tsinghua Science and Technology, ISSN: 1007-0214 09/19 pp. 474-477 vol. 14, No. 4 Date: Aug. 2009.*

(Continued)

*Primary Examiner* — April Y Blair
*Assistant Examiner* — Thien D Nguyen
(74) *Attorney, Agent, or Firm* — Schwabe, Williamson & Wyatt, P.C.

(57) ABSTRACT

Embodiments of apparatus and methods for error detection and correction are described. A codeword may have a data portion and associated check bits. In embodiments, one or more error detection modules may be configured to detect a plurality of error types in the codeword. One or more error correction modules coupled with the one or more error detection modules may be further configured to correct errors of the plurality of error types once they are detected by the one or more error detection modules. Other embodiments may be described and/or claimed.

24 Claims, 9 Drawing Sheets

(56) References Cited

U.S. PATENT DOCUMENTS

| | | | |
|---|---|---|---|
| 2010/0070832 A1* | 3/2010 | Andreev et al. | 714/784 |
| 2010/0299575 A1 | 11/2010 | Roth et al. | |
| 2010/0306582 A1 | 12/2010 | Han et al. | |
| 2011/0154158 A1 | 6/2011 | Yurzola et al. | |
| 2011/0239084 A1 | 9/2011 | Abbasfar | |
| 2012/0290893 A1* | 11/2012 | Hauske et al. | 714/758 |
| 2012/0290899 A1* | 11/2012 | Cideciyan et al. | 714/773 |
| 2013/0179748 A1* | 7/2013 | Dong et al. | 714/755 |

OTHER PUBLICATIONS

International Search Report and Written Opinion for PCT/US2013/047441, mailed Oct. 7, 2013, 9 pages.

* cited by examiner

Burst Errors
300

| Pattern Number 310 | Error Bit Pattern 320 | Error Source 330 | Weight 340 |
|---|---|---|---|
| 1 | 111 | Single Wire Fault | Odd |
| 2 | 1101 | | Odd |
| 3 | 1011 | | Odd |
| 4 | 1111 | | Even |
| 5 | 1---1---1 | Neighborhood Bits Fault | Odd |
| 6 | 1---1---0---1 | | Odd |
| 7 | 1---0---1---1 | | Odd |
| 8 | 1---1---1---1 | | Even |

ERROR DETECTION AND CORRECTION APPARATUS AND METHOD

FIELD OF THE INVENTION

The present disclosure relates generally to microprocessor and memory apparatuses and methods, and more particularly, apparatuses and methods for detecting and correcting errors of a plurality of error types.

BACKGROUND

Recently, die-stacking technology enables multiple layers of dynamic random-access memory (DRAM) and/or a logical die to be integrated into a vertical stack. Together with a fast interconnection, stacked memory may provide a high-bandwidth and low-latency memory subsystem.

A promising use of stacked DRAM is as a memory-side cache. Using DRAM as a cache generally requires also the implementation of a tag array. However, the whole tag overhead may be too large to be stored on-chip. For example, a 1 GB DRAM cache with 64-byte blocks can require up to 96 MB of tag storage. One approach is to store the tag entry with data in DRAM. This approach may negatively impact reliability. A bit flip in the tag may cause all data in the whole cache line to be misused because both tag and data are stored together.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The description may use the phrases "in one embodiment", "in an embodiment", "in another embodiment", "in embodiments", "in various embodiments", or the like, which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
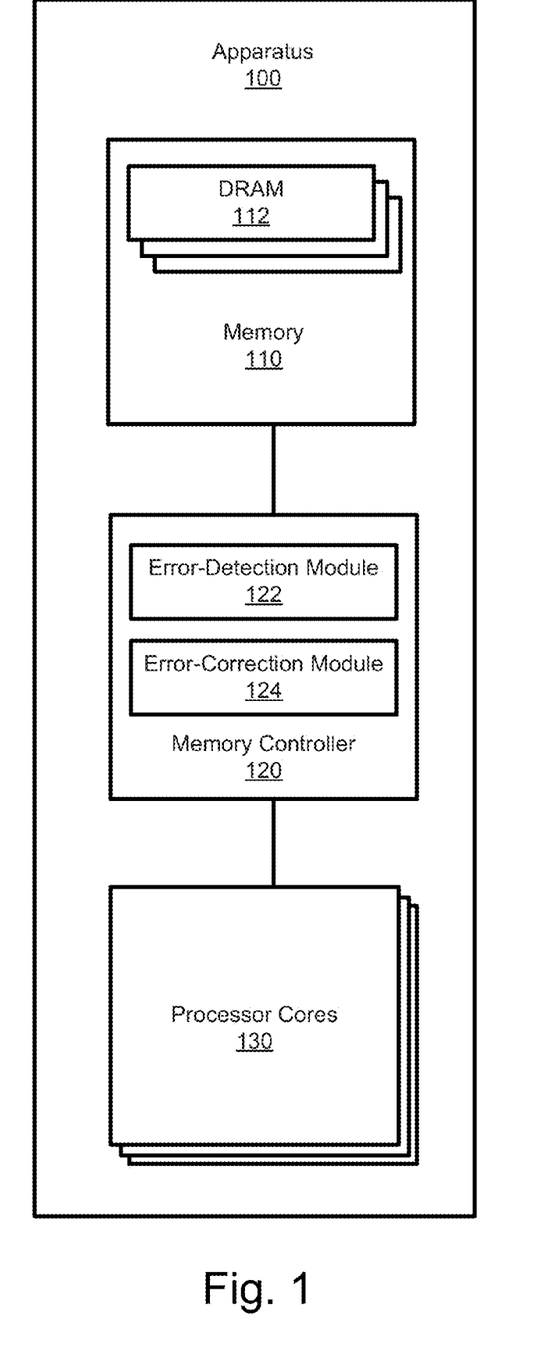
FIG. 1 is a block diagram illustrating an example apparatus incorporating aspects of the present disclosure, in accordance with various embodiments.

Referring now to FIG. 1, a block diagram is shown illustrating an example apparatus incorporating aspects of the present disclosure, in accordance with various embodiments. In embodiments, apparatus 100, such as an information processing system or a computer, may include memory 110, memory controller 120, and one or more processor cores 130.

In embodiments, memory 110, also called storage or computer data storage, may include computer components and recording media used to keep digital data. In one embodiment, memory 110 may be processor registers and cache. In another embodiment, memory 110 may be in the form of on-line mass storage device, such as a hard drive as a secondary storage. On-line mass storage device may include non-volatile memory which may come in various forms, including but not limited to NAND (flash) memory, ferroelectric random-access memory (FeTRAM), nanowire-based non-volatile memory, memory that incorporates memristor technology, MRAM, STT-MRAM, three dimensional (3D) cross point resistive memory such as phase change memory (PCM) or PCM and switch (PCMS), and so forth. Yet in another embodiment, memory 110 may be in the form of an off-line bulk storage device, such as a DVD-ROM as a tertiary storage.

Yet in another embodiment, memory 110 may include controller cards and system random-access memory (RAM), such as DRAM 112. RAM enables stored data to be accessed in any random order with similar amount of time regardless of data storage location. The main forms of modern RAM include, but are not limited to, static RAM (SRAM) and dynamic RAM (DRAM). SRAM may exhibit data remanence while capacitor charge in DRAM must be refreshed periodically to retain information. SRAM and DRAM are both volatile because data is eventually lost when the memory is not powered. Circuits in DRAM 112 may be integrated with the traditional horizontal or planar approach or the modem die-stacking technology. Die-stacking, also known as chip stacking or vertical integration, is a process of mounting multiple chips vertically to increases the amount of silicon chip within a single semiconductor package and to achieve better electrical performance with the shorter routing of interconnections between circuits. Die-stacking may be applied to both volatile and non-volatile memory.

Memory controller 120 may be configured to provide an interface to memory 110 and manage the flow of data going to and from memory 110. In embodiments, memory controller 120 may be in the form of a separate chip or integrated with memory 110. In embodiments, memory controller 120 may be implemented on a motherboard or form an integrated memory controller (IMC) on the microprocessor to potentially reduce memory latency.

In embodiments, memory controller 120 may have error-detection module 122 and error-correction module 124. In some cases, errors may be introduced during transmission in a noisy channel as many communication channels are subject to channel noise. In other cases, errors may be introduced in storage. For example, the radioactive atoms in a chip's material may decay. The decay may produce a particle that strikes a memory cell to change its state and causing single-bit upset (SBU) or multiple-bit upset (MBU). With die-stacking technology, the same particle may have a great impact in terms of affected bits. In embodiments, error-detection module 122 may be configured to detect of errors caused by noise or other impairments during transmission or storage; error-correction module 124 may be configured to reconstruct the original error-free data in best effort.

Error detection and correction may generally achieved by adding some redundancy to the data, such as one or more check bits which can be used later to verify the integrity of the data, and to recover data determined to be corrupted. As an example, forward error correction (FEC) or channel coding may use an error-correcting code to encode data and later decode the data with the capability to recover a type of error, such as random errors. In embodiments, error-detection module 122 may be configured to detect for presence of errors of multiple types of error, such as burst errors as well as random errors. Subsequently, error-correction module 124 may be configured to correct errors of multiple types of error once they are detected by error-detection module 122.

In embodiments, processor cores 130 may have one or more central processing units (CPU) or cores wherein each core can read and execute CPU instructions such as add, move, branch, read, write, and so forth. With multiple cores integrated onto a single integrated circuit die or multiple dies in a single chip package, a multi-core processor is amenable to parallel computing, thus increasing overall computing speed.

Figure 2:
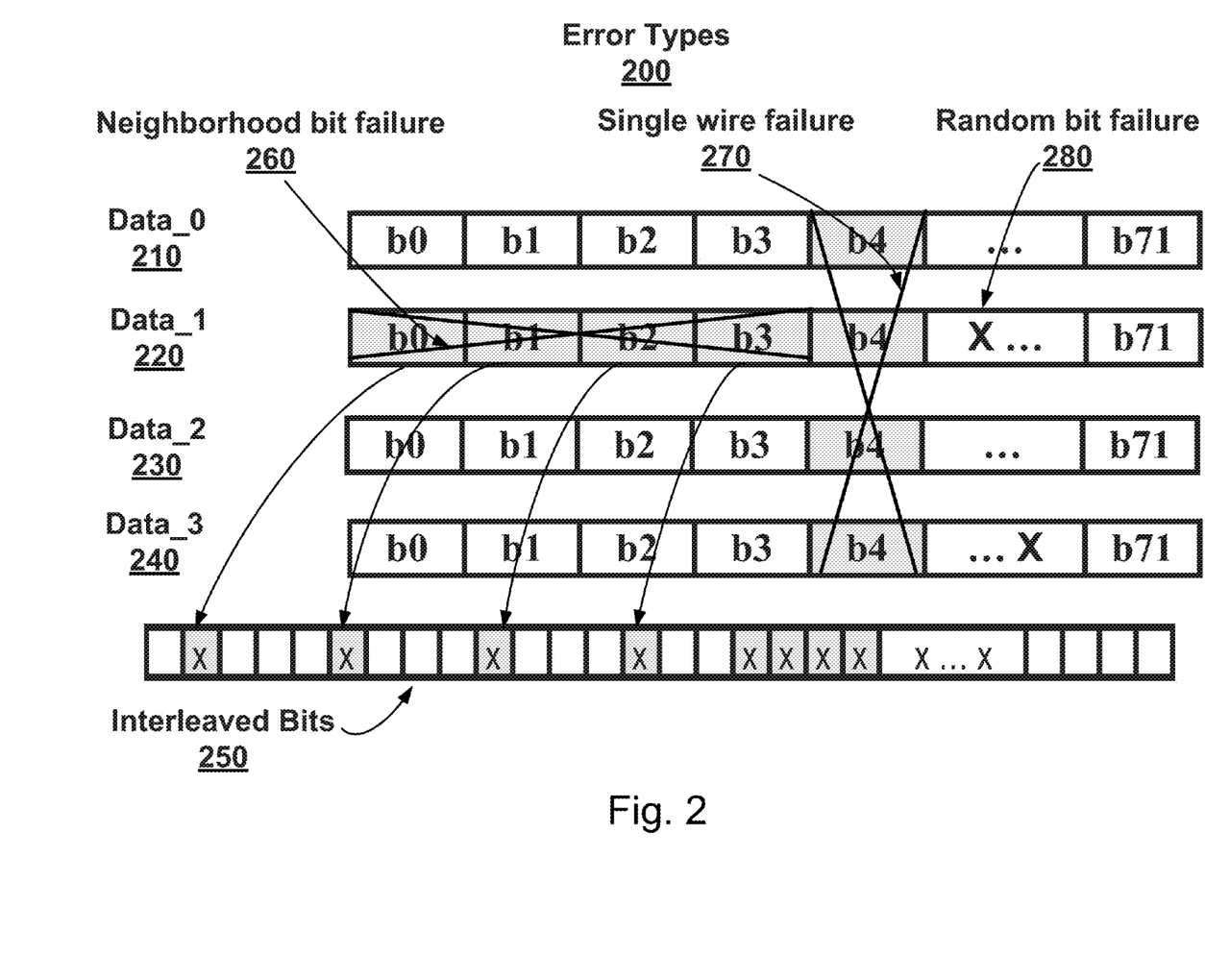
FIG. 2 illustrates a plurality of error types into which aspects of the present disclosure may be applied, in accordance with various embodiments.

Referring now to FIG. 2, a plurality of error types 200 are shown into which aspects of the present disclosure may be applied, in accordance with various embodiments. Errors may occur randomly but with a certain probability profile. Errors may also occur primarily in bursts. Therefore errors may in general be broadly grouped as random errors and burst-errors. In FIG. 2, four data transfers Data_0 210, Data_1 220, Data_2 230, and Data_3 240, e.g., from half of a cache line, are shown as being transferred in an interleaved manner 250. As shown, error types 200 may include random errors and burst errors. Random errors may be caused by random bit failure 280 while burst errors may be caused by neighborhood bit failure 260 and/or single wire failure 270. Hereinafter, error types may also be referred to as types of error, which may be considered synonymous for purposes of this disclosure, unless the context clearly indicates otherwise; and thus, the terms may be used interchangeably.

The failure of a memory chip may cause hard errors which cannot be rectified even after rebooting the system. The memory chip needs to be replaced to rectify hard errors. In contrast, soft errors in chip-level or system-level only change data or instructions in a program. Soft errors may be corrected by rewriting correct data or by error detection and correction techniques on the fly. Beside random soft and hard errors, memory controller 120, as a link between processor cores 130 and memory 110, may become another source of errors. For example, due to the burst transfer on DRAM channels, a single wire failure 270 on data bus can manifest as a 4-bit error across Data_0 210, Data_1 220, Data_2 230, and Data_3 240 for a half cache line (32B). As another example, a multi-bit failure in one memory chip may cause multiple neighborhood bits to fail in Data_1 220.

In embodiments, these aforementioned failures may be detected and corrected through error-detection module 122 and error-correction module 124. In the case of DRAM cache, data integrity needs to be protected extensively and efficiently. However, conventional DRAM error-correcting code (ECC) schemes in general cannot be applied to DRAM cache because of lacking enough bits. The DIMM structure may be fixed, i.e. one ECC chip per 8 data chips. Storing tag and meta-data with data would directly reduce the number of bits reserved for ECC. Moreover, conventional ECC techniques, such as double-error correction and triple-error detection (DEC-TED), cannot correct multiple types of error. Error-detection module 122 and error-correction module 124, in particular, embodiments characterized by special designed parity-check matrices, may correct both random and burst errors with low overhead similar to DEC-TED.

Figure 3:
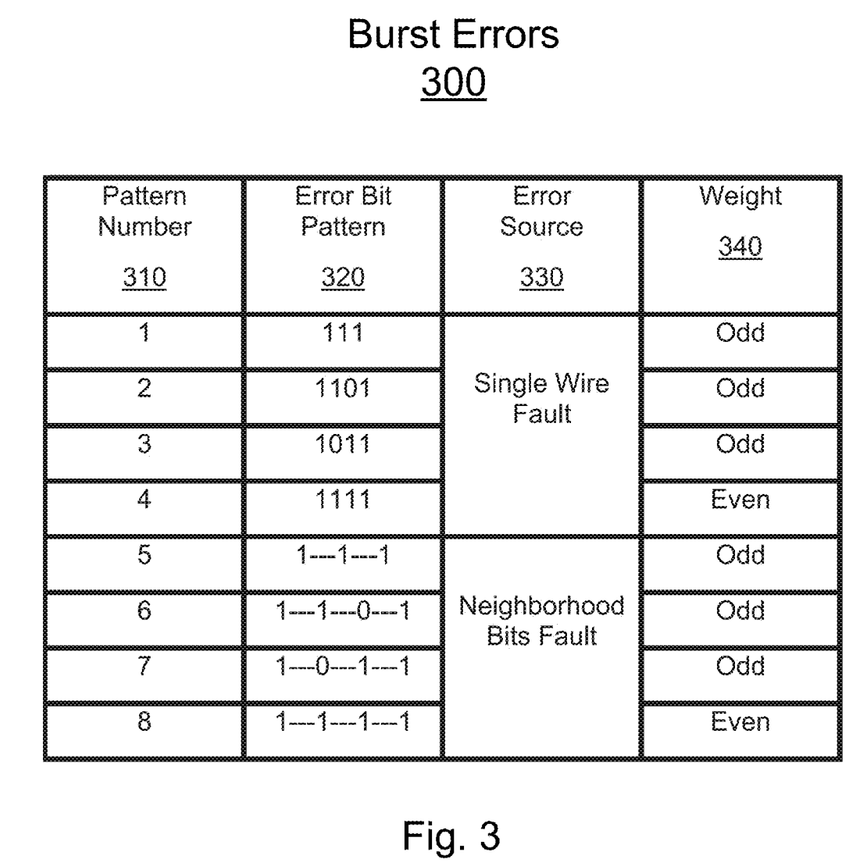
FIG. 3 illustrates a plurality of burst errors into which aspects of the present disclosure may be applied, in accordance with various embodiments.

Referring now to FIG. 3, a plurality of burst errors 300 are shown into which aspects of the present disclosure may be applied, in accordance with various embodiments. As shown, the plurality of burst errors 300 may be numbered by pattern number 310 with distinguishable error bit pattern 320 after bit interleaving where '1' means bit failure, '0' means valid, and '-' means a valid bit but comes from a different transfer. As shown, pattern numbers 1-4 are caused by single wire fault while pattern numbers 5-8 are caused by neighborhood bits fault under error source 330. Weight 340 of a codeword represents the number of nonzero entries, thus, numerically is either odd or even.

Error-detection module 122 and error-correction module 124, in particular, embodiments with ECC characterized by special designed parity-check matrices, may retain random double-error correction capability, but also correct single wire and neighborhood bit failures as shown in FIG. 2. Multi-bit error patterns based in FIG. 2 are enumerated in FIG. 3 after eliminating single and double-bit cases. Recall that the four transfers are bit-interleaved during transmission for the embodiments, e.g., half cache line data, illustrated in FIG. 2. A single wire fault thus may manifest as an error in four adjacent bits, and the neighborhood bit fault in a same transfer may be separated by a distance of 4 in the transmission. In either case, the exact number of bit flip may depend on the stored bit values.

Figure 4:
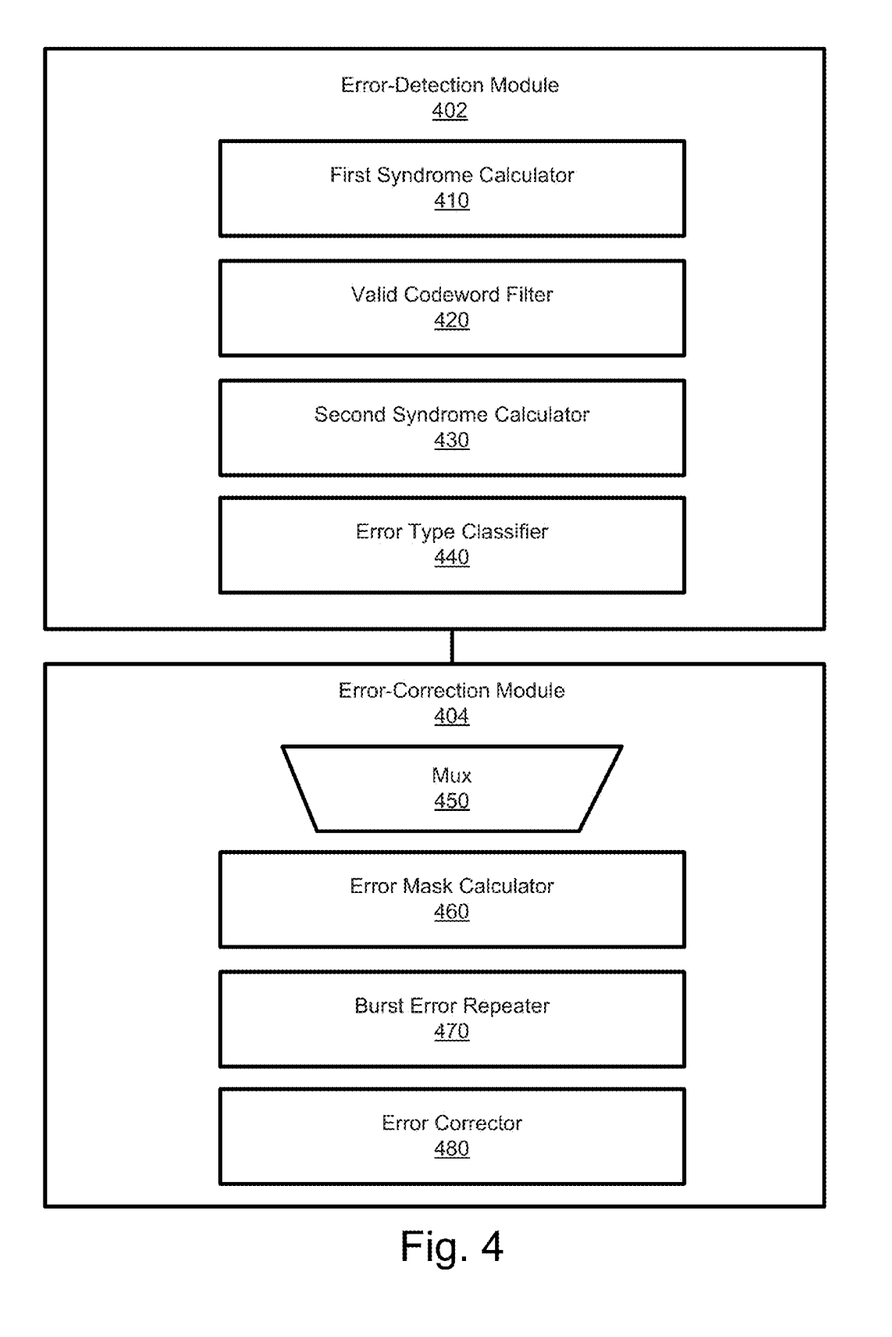
FIG. 4 is a block diagram illustrating an example error-detection module and an example error-correction module incorporating aspects of the present disclosure.

Referring now to FIG. 4, an example error-detection module 402 and an example error-correction module 404 are illustrated incorporating aspects of the present disclosure, in accordance with various embodiments. As described above, errors may occur randomly but with a certain probability profile, or occur dynamically in burst. Error-detection module 402 may be configured to detect a mixture of random errors and burst errors while error-correction module 404 may be configured to correct the mixture of random errors and burst errors. Therefore error-detection module 402 and error-correction module 404 may be configured to collectively achieve error control.

In embodiments, error-detection module 402 may be configured with various components, such as first syndrome calculator 410, valid codeword filter 420, second syndrome calculator 430, and error type classifier 440, operatively coupled with each other as shown in FIG. 4. For ease of understanding, second syndrome calculator 430 may also be referred to as normalized syndrome calculator 430. In embodiments, error-correction module 404 may be configured with various components, such as mux 450, error mask calculator 460, burst error repeater 470, and error corrector 480, operatively coupled with each other as shown in FIG. 4.

In embodiments, first syndrome calculator 410 may be configured to calculate a syndrome based on specially configured parity-check matrices. Each ECC may be uniquely defined by its parity-check matrix, also called H-matrix. The H-matrix generally may determine the error syndromes composition, error correcting and detection capability. The H-matrix in first syndrome calculator 410 may be configured such that selected burst error patterns, such as single wire fault and neighborhood bits fault as described in FIG. 3, can be exclusively identified and corrected.

In general, the error syndrome of a burst error is proportional to the syndrome of its first error bit, and the scale is a constant for each specific burst pattern. In embodiments, the columns in the parity-check matrix may be rearranged to ensure that all burst errors that needs to be corrected are both detectable and correctable. Detectable, as used herein, refers to the fact that syndromes of burst errors are nonzero and distinct to all correctable random errors. Correctable, as used herein, refers to the fact that syndromes of burst errors are nonzero and mutually different. Further, in embodiments, the new ECC used in first syndrome calculator 410 may be based on BCH-based DEC-TED code, therefore retains the random double-error correction capability.

A common type of ECC used to protect on-chip caches are BCH codes. BCH codes form a class of cyclic error-correcting codes constructed using finite fields. BCH codes were first developed on or about 1959 by Hocquenghem, Bose and Ray-Chaudhuri where the name of these codes comprises the initials of the inventors. Equation (1) below shows a standard H-matrix for conventional DEC-TED BCH code. A person skilled in the art may appreciate that the first row of all 1's are essentially an overall parity. With overall parity bit in the syndrome, odd errors may be distinguished from even errors automatically.

$$H_1 = \begin{bmatrix} 1 & 1 & 1 & 1 & \ldots & 1 & \ldots & 1 \\ 1 & \alpha & \alpha^2 & \alpha^3 & \ldots & \alpha^i & \ldots & \alpha^{(N-2)} \\ 1 & \alpha^3 & \alpha^6 & \alpha^9 & \ldots & \alpha^{3i} & \ldots & \alpha^{3(N-2)} \end{bmatrix} \quad (1)$$

Each column in equation (1) may be treated as an element, and the H-matrix in equation (1) may be rewritten into equation (2) below.

$$H_1 = [h_0\ h_1\ h_2\ h_3 \ldots h_i \ldots h_{N-2}], \text{ where } h_i = [1, a^i, a^{3i}]^{-1} \quad (2)$$

The H-matrix in above equations may be used to calculate the syndrome of a codeword. Any valid codeword must have a zero syndrome. Non-zero syndrome means the codeword is invalid, and the value of syndrome is related to error bits. More specifically, in a linear code, the error syndrome equals to the sum of H-matrix columns that corresponds to the error bits. For example, if there are three errors at bit position of i, j and k, the syndrome would equal to $h_i+h_j+h_k$.

Based on equation (1) and equation (2), it may be observed that $h_{i+1}=h_i*A$ where A equals to $[1,a,\alpha^3]$, and $h_i=h_0*A^i$. Thus the H-matrix in equation (2) may be rewritten into equation (3) below where the H-matrix columns are represented in a geometric sequence.

$$H_1 = [h_0\ h_0A\ h_0A^2\ h_0A^3 \ldots h_0A^i \ldots h_0A^{N-2}], \text{ where } A = [1, a, a^3]^{-1} \quad (3)$$

Based on equation (3), it may be observed that the syndrome of burst errors may be represented by the syndrome of its first error bit multiplied by a fixed scale. Using burst errors 300 in FIG. 3 as an example, let $K_n$ be referred as the burst coefficient to represent the fixed value for $n^{th}$ pattern in FIG. 3. There, if the errors are located in bit position of (i, i+1, i+2), the error syndrome would be $h_i+h_{i+1}+h_{i+2}=h_i*(1+A+A^2)$, where $K_1=(1+A+A^2)$ is a fixed value no matter where the first bit starts. As another example, similarly, $K_6=(1+A^4+A^{12})$ may be found for pattern 6 (1 - - - 1 - - - 0 - - - 1) in FIG. 3. By the same token, a burst coefficient may be found for each burst pattern in FIG. 3.

There may be many advantages of using burst coefficients $K_n$ in error-detection module 402 and error correction module 404. One advantage may be using this single parameter $K_n$ to represent a group of errors, thus helps for cross comparing all syndrome values and greatly reducing all the number of comparisons. Otherwise the design space becomes so big that blindly search is not practical. Another advantage may be using this single parameter $K_n$ to help for identifying the burst type. A syndrome may be normalized with each burst coefficient. A burst pattern may be found when the result equals to a single-bit syndrome. Yet another advantage may be using this single parameter $K_n$ to simplify the error correcting. Once the first error bit from the subsequently calculated normalized syndrome is found (to be described more fully below), the rest of the bits may be supplemented according to its burst pattern to form a completed error mask.

The H-matrix used in error-detection module 402 may be further configured to assure that all burst patterns in FIG. 3 are detectable and correctable. In embodiments, the H-matrix may be configured to produce a non-zero value for a codeword with at least one error. That happens to be the case because DECTED has Hamming distance of 6, thus having an error alias to a valid word requires at least 6 bit of difference. However, burst patterns in FIG. 3 may have a maximum bit weight of 4. Therefore none of the syndromes derived from FIG. 3 would be zero. Moreover, in embodiments, the H-matrix may be configured to enable differentiation of burst error syndromes and random error syndromes. Furthermore, in embodiments, the H-matrix may be configured to enable differentiation of a plurality of burst error syndromes which is to assure that all burst error syndromes are distinct to each other. Additionally, the H-matrix may be configured to enable differentiation between an odd burst syndrome and a single-bit error syndrome, between an even burst syndrome and a double-bit error syndrome.

In embodiments, the columns of the H-matrix may be rearranged to assure that all burst patterns in FIG. 3 are detectable and correctable. According to the BCH code definition, the H-matrix columns can be rearranged in any order, and the result is still a valid H-matrix. However, if the columns are to be shuffled arbitrarily, the property of geometric sequence thus the burst coefficients would be lost. In embodiments, the columns of the H-matrix may be rearranged based on the rearrangement property of Fermat's Little Theorem in number theory. Specifically, one may rearrange the H-matrix column by picking one column every L columns, where L and (N−1) are co-prime, and N is the degree of the finite field $GF(2^m)$ where the BCH code is based on. L may be called the step size of rearranged H-matrix. H-matrix ($H_2$) with the step size of rearranged H-matrix (L) is shown in equation (4) below. The H-matrix ($H_1$) in equation (2) would be a special case when L=1.

$$H_2 = \lfloor h_0\ h_L\ h_{2L}\ h_{3L} \ldots h_{iL} \ldots h_{(N-2)L} \rfloor, \text{ where}$$
$$h_{iL} = h_{iL\%N-1} \text{ for any } i \quad (4)$$

As an example, if a DECTED code is based on $GF(2^9)$, (N−1) in this case equals to $2^9-1=511$, and the total number of co-primes for N is 432. Thus there are 432 varieties of the H-matrix that may be tested. By trying all different L values, one may find a step size and thus the H-matrix to assure that all burst patterns in FIG. 3 are detectable and correctable.

In embodiments, the first syndrome calculated by first syndrome calculator 410 may be sent to valid codeword filter 420 to determine the validity of the codeword. Recall that valid codeword has a zero syndrome. Non-zero syndrome means the codeword is invalid. Valid codeword may need no further correction. Invalid codeword may be further processed for determining its error type and/or error subtype.

In embodiments, the first calculated syndrome may be further sent to second syndrome calculator 430 which may be configured to calculate the normalized syndrome, or the first-bit syndrome, for potential burst errors. Using burst errors in FIG. 3 as an example, there are 8 types of burst errors, and therefore 8 normalized syndromes, from syndrome $K_1$ to syndrome $K_8$ where normalized syndrome equals to the first calculated syndrome divided by burst coefficient K.

In embodiments, the normalized syndrome calculated by normalized syndrome calculator 430 as well as the first calculated syndrome calculated by first syndrome calculator 410 may be sent to error type classifier 440. Error type classifier 440 may be configured to classify error types of an error. In embodiments, error type classifier 440 may be configured to determine whether an error is a correctable error or an uncorrectable error, in case of a correctable error, whether it is a random error or a burst error. Moreover, error type classifier 440 may be configured to determine the subtype of an error. For example, a random error may be classified as single-bit error, double-bit error, and uncorrectable errors; a burst error may be classified with its burst error pattern. In embodiments, the burst error pattern may be detected if any of the normalized syndromes is a valid single-bit syndrome. Otherwise, the error may be a random error.

In embodiments, error-correction module 404 may receive a codeword with first calculated syndrome and/or normalized syndrome as well as error classification information, for example, including error types and error subtypes, from error-detection module 402. In general, burst errors may be corrected by locating the first error bit and supplement the rest bits according to its burst pattern. In embodiments, mux 450 may be configured to select which input, first calculated syndrome or normalized syndrome, should be provided to the rest of error correction logic. The selection may be based on signal and/or information received from error type classifier 440.

In embodiments, error mask calculator 460 may be configured to calculate the error mask based on either first calculated syndrome or normalized syndrome sent by mux 450. If the error is classified as a random error, then the error mask may be applied by error corrector 480 directly on the codeword with the random error. If the error is classified as a burst error, then the error mask coming out of error mask calculator 460 may only comprise the first error bit. Burst error repeater 470 may be configured to supplement the rest of the error bits to the first error bit to form a whole error mask. For example, for the burst pattern #3 (1011) in FIG. 3, the error mask may have the $200^{th}$ bit set to 1. The complete error mask after burst error repeater 470 would include not only $200^{th}$ but also $202^{nd}$ and $203^{rd}$ bits. Then, error corrector 480 may be configured to add the error mask to the codeword. Specifically, those bits that correspond to '1's in mask may be flipped and thus be corrected.

Figure 5:
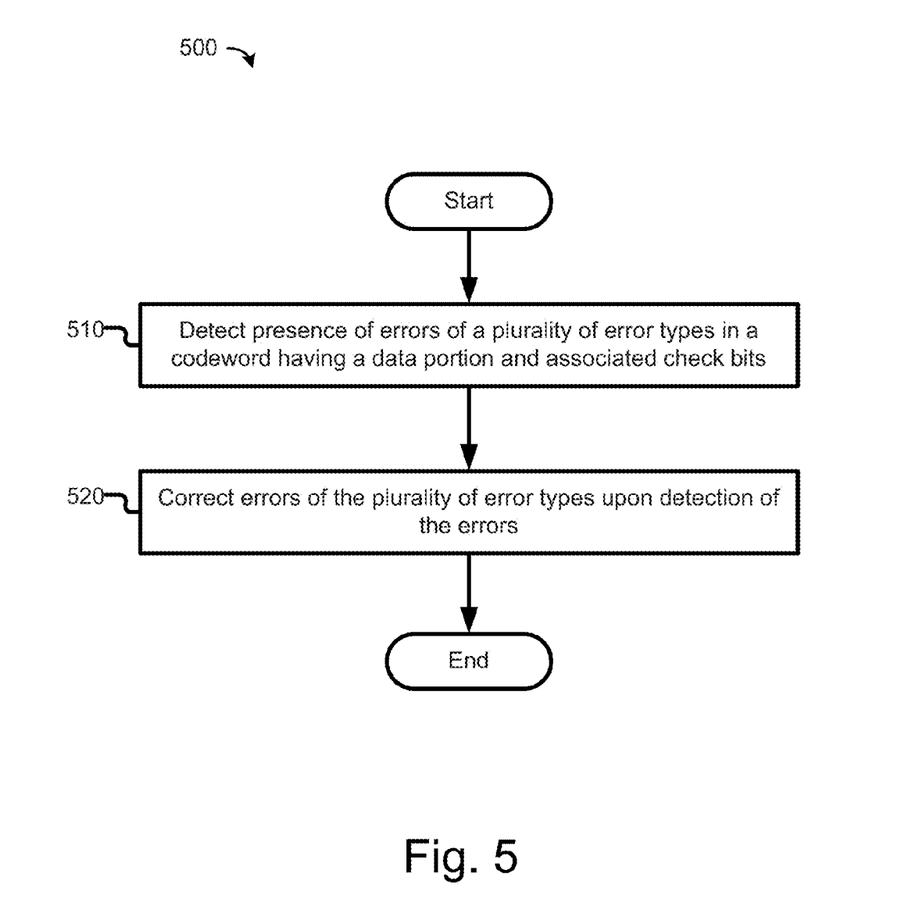
FIG. 5 illustrates an example error detection and correction process incorporating aspects of the present disclosure, in accordance with various embodiments.

FIG. 5 illustrates an example error detection and correction process 500 incorporating aspects of the present disclosure, in accordance with various embodiments. As shown, process 500 may be performed by error-detection module 402 and error-correction module 404 to implement one or more embodiments of the present disclosure. In embodiments, the process may begin at block 510, where error-detection module 402 may detect errors of a plurality of error types in a codeword having a data portion and associated check bits in connection with various embodiments disclosed in FIG. 4. Next, at block 520, error-correction module 404 may correct the errors of the plurality of error types upon detection of the errors in block 510. In some embodiments, process 500 may then be repeated starting at block 510 for additional operational cycles. In some embodiments, process 500 may instead end.

Figure 6:
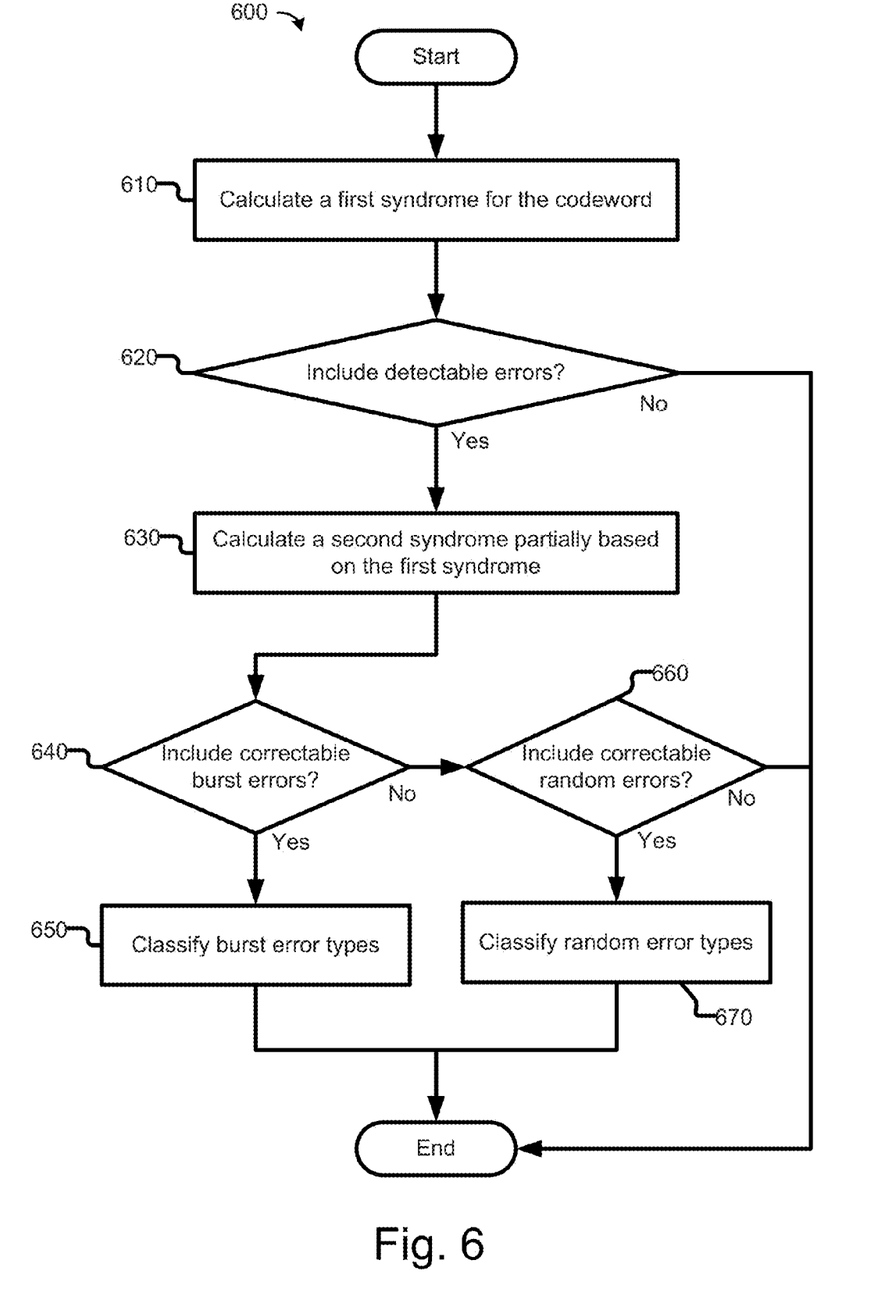
FIG. 6 illustrates an example error detection process incorporating aspects of the present disclosure, in accordance with various embodiments.

FIG. 6 illustrates an example error detection process 600 incorporating aspects of the present disclosure, in accordance with various embodiments. In embodiments as shown, error detection process 600 may be performed by error-detection module 402, as an example, to implement one or more embodiments of the operation of block 510 of process 500. The process may begin at block 610, where first syndrome calculator 410, as an example, may calculate a first syndrome for a codeword. Next, at block 620, valid codeword filter 420, as an example, may determine the validity of the codeword. If it is determined that no detectable error is present, process 600 may end, for example, if the first syndrome equals to zero. If it is determined that one or more detectable errors are present, process 600 may proceed to block 630.

At block 630, normalized syndrome calculator 430, as an example, may calculate a normalized syndrome partially based on the first calculated syndrome. In embodiments, the first calculated syndrome may be normalized with each burst coefficient. With the first calculated syndrome and/or the normalized syndrome, process 600 may proceed for error type determination.

A decision may be made at decision block 640 regarding whether correctable burst errors may be present in the codeword. At decision block 640, if it is determined that at least one correctable burst error is present, process 600 may proceed to block 650 where burst errors are to be classified into their error subtypes, such as different burst error patterns in FIG. 3. If it is determined that no correctable burst error is present, process 600 may proceed to block 660 for further error type determination.

Similarly, another decision may be made at decision block 660 regarding whether correctable random errors may be present in the codeword. At decision block 660, if it is determined that one or more correctable random errors are present, process 600 may proceed to block 670 where random errors are to be classified into their error subtypes, such as single-bit error, double-bit error, etc. If it is determined that no correctable random error is present, that leads to some types of detectable but uncorrectable errors. If a detectable but uncorrectable error is present, process 600 may end, and it may also lead to a system halt or machine check in some embodiments.

Figure 7:
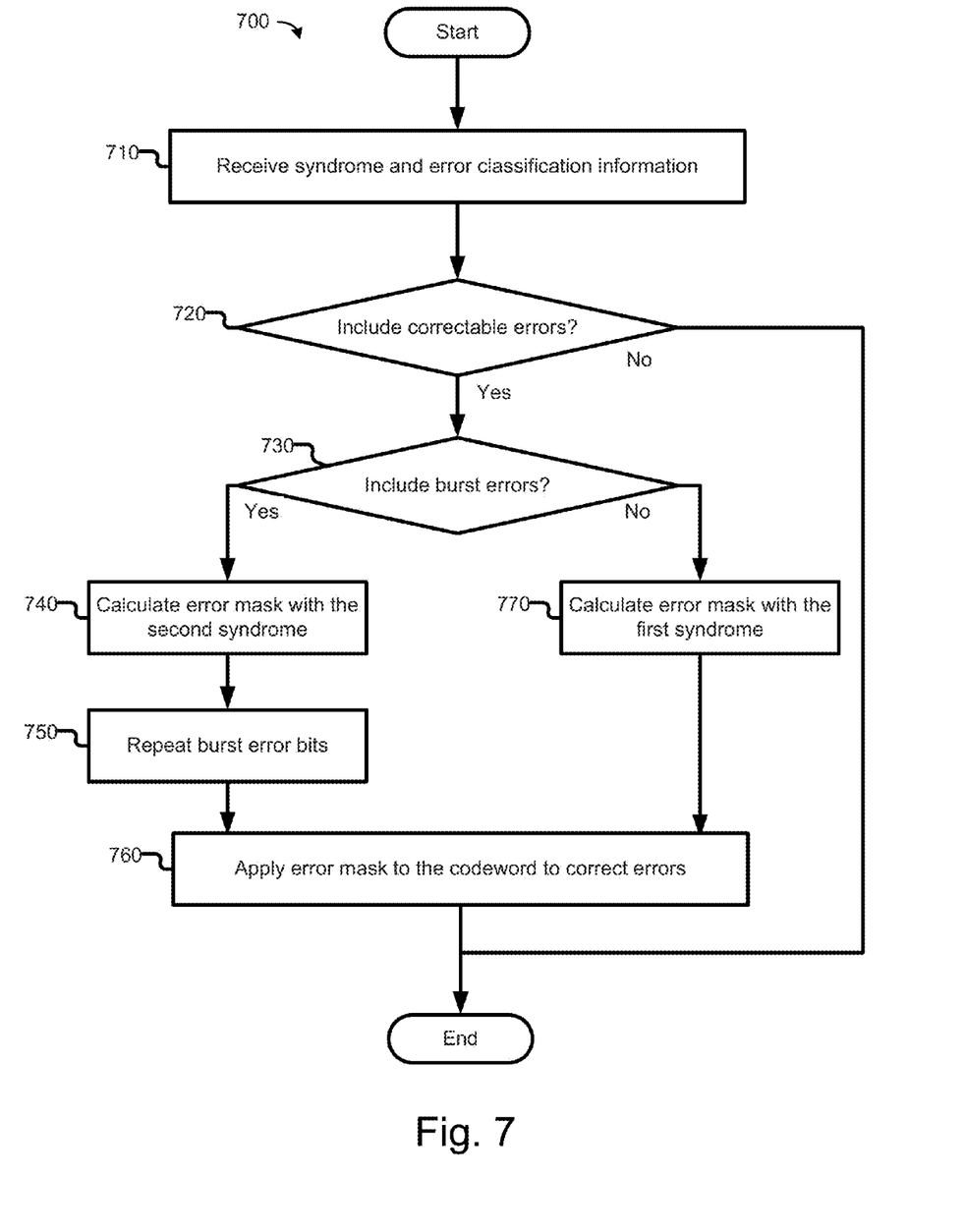
FIG. 7 illustrates an example error correction process incorporating aspects of the present disclosure, in accordance with various embodiments.

Referring now to FIG. 7, that figure illustrates an example error correction process 700 incorporating aspects of the present disclosure, in accordance with various embodiments. As shown, process 700 may begin at block 710, where error-correction module 404, as an example, may receive a codeword with first syndrome and/or normalized syndrome as well as error classification information from error-detection module 402. Next, a decision may be made at decision block 720 regarding whether correctable errors may be present in the codeword. At decision block 720, if it is determined that no correctable error is present, process 700 may end. If it is determined that one or more correctable errors are present, including burst errors or random errors, process 700 may proceed to decision block 730 for further actions. At block 730, a decision may be made regarding whether burst errors may be present in the codeword. Mux 450, as an example, may be configured to make such decisions in block 720 and block 730 in various embodiments.

At decision block 730, if it is determined that no burst error is present which means the correctable error is generally random error type. Thus process 700 may continue to block 770 where error mask is calculated with the first syndrome, for example, by error mask calculator 460. However, if it is determined that one or more burst errors are present at block 730, process 700 may proceed to block 740 where error mask is calculated with the normalized syndrome, for example by error mask calculator 460. If the error is classified as a burst error, then the error mask would only comprise the first error bit. Subsequently, at block 750, the rest of the error bits may then be supplemented, for example by burst error repeater 470, to form a complete error mask. Finally, at block 760, the error mask, sent from either block 750 or 770, may be applied to the codeword to rectify errors, for example by error corrector 480.

Figure 8:
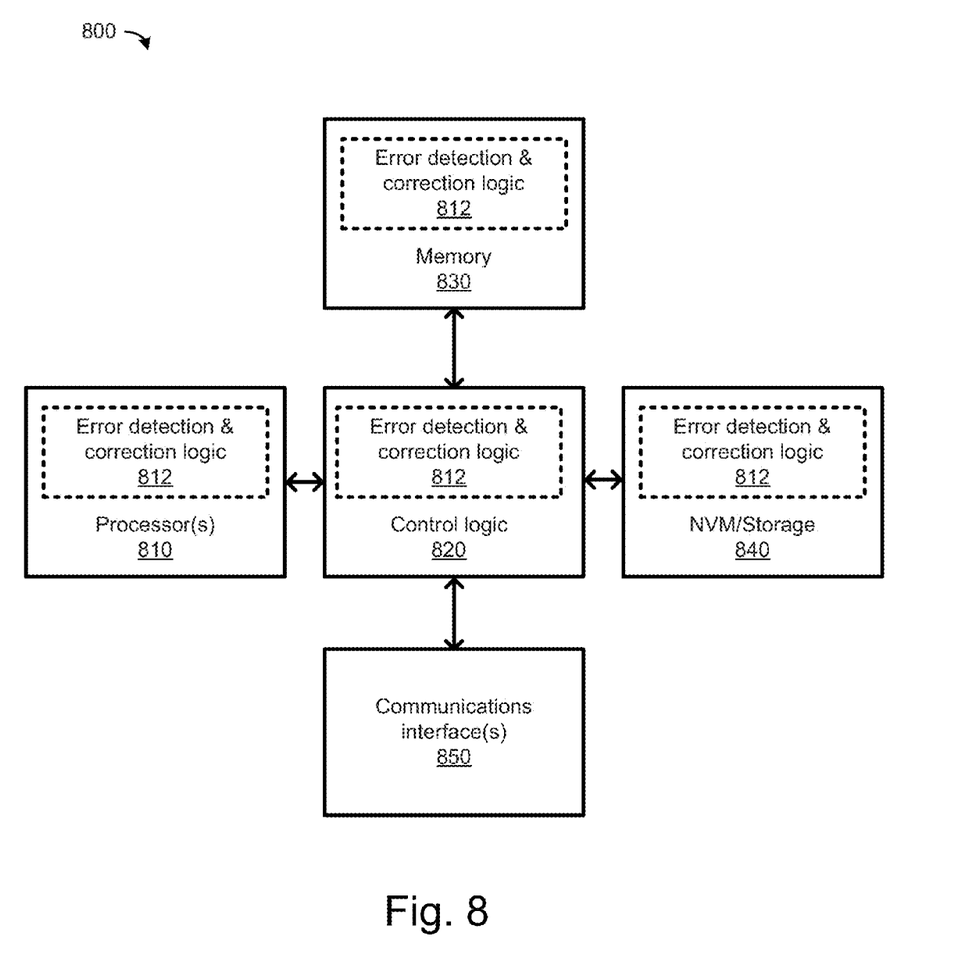
FIG. 8 illustrates an example computing system/device into which aspects of the present disclosure may be incorporated, in accordance with various embodiments.

FIG. 8 illustrates an example computing system/device 800 into which aspects of the present disclosure may be incorporated, in accordance with various embodiments. As illustrated, example computing system/device 800 may include control logic 820 coupled to at least one of the processor(s) 810, memory 830 coupled to control logic 820, non-volatile memory (NVM)/storage 840 coupled to control logic 820, and one or more communications interfaces 850 coupled to control logic 820. In embodiments, each of the one or more processor(s) 810 may be include one or more processor cores. Memory 830 may include memory 110 in FIG. 1, as earlier described.

In one embodiment, control logic 820 may include any suitable interface controllers to provide for any suitable interface to at least one of the processor(s) 810 and/or to any suitable device or component in communication with control logic 820. In another embodiment, control logic 820 may include one or more input/output (I/O) controller(s) to provide an interface to NVM/storage 840 and communications interfaces 850. Yet in another embodiment, control logic 820 may include one or more memory controller(s) to provide an interface to memory 830. Memory 830 may be used to load and store data and/or instructions, for example, for system/device 800. In one embodiment, memory 830 may include any suitable volatile memory, such as suitable dynamic random access memory (DRAM), for example. In embodiments, DRAM may be stacked using die-stacking technology. Moreover, stacked DRAM may be used as a memory-side cache.

NVM/storage 840 may be used to store data and/or instructions. In embodiments, NVM/storage 840 may include any suitable non-volatile memory, including but not limited to NAND (flash) memory, ferroelectric random-access memory (FeTRAM), nanowire-based non-volatile memory, memory that incorporates memristor technology, MRAM, STT-MRAM, three dimensional (3D) cross point resistive memory such as phase change memory (PCM) or PCM and switch (PCMS), and so forth. In embodiments, NVM/storage 840 may include any suitable non-volatile storage device(s), such as one or more hard disk drive(s) (HDD(s)), one or more solid-state drive(s), one or more compact disc (CD) drive(s), and/or one or more digital versatile disc (DVD) drive(s), for example.

NVM/storage 840 may include a storage resource physically part of a device on which the system/device 800 is installed or it may be accessible by, but not necessarily a part of, the device. For example, the NVM/storage 840 may be accessed over a network via communications interface(s) 850.

Memory 830 and NVM/storage 840 may include, in particular, hardware and/or software implementations of error detection and correction logic 812. The software portion of error detection and correction logic 812 may include instructions that when executed by at least one of the processor(s) 810 (or an embedded controller (not shown) result in the system/device 800 practicing one or more of the error detection and correction processes described above. In other embodiments, the hardware and/or software implementation of error detection and correction logic 812 may be located in control logic 820 and/or processor(s) 810.

Communications interface(s) 850 may provide an interface for system/device 800 to communicate over one or more network(s) and/or with any other suitable device. Communications interface(s) may include any suitable hardware and/or firmware, such as a network adapter, one or more antennas, a wireless interface, and so forth. In embodiments, communication interface(s) 850 may include an interface for system/device 800 to be coupled to a wired or wireless, public and/or private, local and/or wide area networks. In embodiments, communication interface(s) 850 may include an interface for system/device 800 to use NFC, optical communications (e.g., barcodes), Bluetooth or other similar technologies to communicate directly (e.g., without an intermediary) with another device.

For one embodiment, at least one of the processor(s) 810 may be packaged together with control logic 820 and/or error detection and correction logic 812. For one embodiment, at least one of the processor(s) 810 may be packaged together with control logic 820 and/or error detection and correction logic 812 to form a System in Package (SiP). For one embodiment, at least one of the processor(s) 810 may be integrated on the same die with control logic 820 and/or error detection and correction logic 812. For one embodiment, at least one of the processor(s) 810 may be integrated on the same die with control logic 820 and/or error detection and correction logic 812 to form a System on Chip (SoC).

In various implementations, the systems/devices 800 may be a laptop, a netbook, a notebook, an subnotebook, an ultrabook®, a smartphone, a tablet, a personal digital assistant, an ultra mobile PC, a mobile phone, a desktop computer, a server, a printer, a scanner, a monitor, a set-top box, an entertainment control unit (e.g., a gaming console), a digital camera, a digital music player, or a digital video recorder. Additionally, other devices in the above-described interactions may be configured to perform various disclosed techniques.

Figure 9:
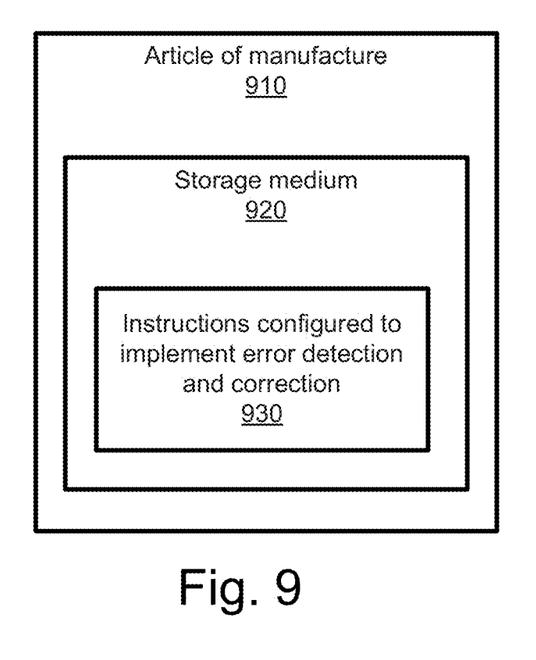
FIG. 9 illustrates an article of manufacture having programming instructions, incorporating aspects of the present disclosure, in accordance with various embodiments.

FIG. 9 illustrates an article of manufacture 910 having programming instructions, incorporating aspects of the present disclosure, in accordance with various embodiments. In various embodiments, an article of manufacture may be employed to implement various embodiments of the present disclosure. As shown, the article of manufacture 910 may include a computer-readable non-transitory storage medium 920 where instructions configured to implement error detection and correction 930 reside. The storage medium 920 may represent a broad range of persistent storage medium known in the art, including but not limited to flash memory, dynamic random access memory, static random access memory, an optical disk, a magnetic disk, etc. Instructions 930 may enable an apparatus, in response to their execution by the apparatus, to perform various operations described herein. For example, storage medium 920 may include instructions 930 configured to cause an apparatus or system to practice some or all aspects of error detection and correction of the process 500 of FIG. 5, in accordance with embodiments of the present disclosure.

Thus, apparatus, methods and storage medium associated with error detection and/or correction have been described. In embodiments, an apparatus may include one or more error detection modules, having one or more error-correcting codes, configured to detect for presence of errors of a number of error types in a codeword having a data portion and associated check bits, using the one or more error-correcting codes. The apparatus may further include one or more error correction modules coupled with the one or more error detection modules, and configured to correct errors of the number of error types, on detection by the one or more error detection modules.

In embodiments, the one or more error detection modules may include a first syndrome calculation module, having at least one of the one or more error-correcting codes, configured to calculate a first syndrome based at least in part on the codeword, and using the at least one error-correcting code; and a second syndrome calculation module, coupled with the first syndrome calculation module, and configured to calculate a second syndrome that is normalized based at least in part on the first syndrome. The first syndrome may enable detection of errors of a first error type of the number of error types, and the second syndrome may enable detection of errors of a second error type of the number of error types.

In embodiments, the one or more error detection modules may include an error type classification module coupled with the second syndrome calculation module, and configured to classify one or more error subtypes of the first error type based at least in part on the first syndrome and one or more error subtypes of the second error type based at least in part on the second syndrome.

In embodiments, the one or more error correction modules may include a multiplex module coupled with at least one of the one or more error detection modules, and configured to selectively output the first syndrome or the second syndrome; an error mask calculation module coupled with the multiplex module, and configured to calculate a first error mask; and an error corrector module coupled with the error mask calculation module, and configured to correct the errors of the number of error types in the codeword by applying the first error mask to the codeword.

In embodiments, the one or more error correction modules may include a burst error repeater module coupled with the error mask calculation module, and configured to supplement a number of missing error bits to the first error mask to form a second error mask. The error corrector module may be configured to correct the errors of the number of error types in the codeword by applying the second error mask to the codeword.

In embodiments, the multiplex module may be configured to select the first syndrome or the second syndrome based at least in part on information received from the error type classification module.

In embodiments, the one or more error-correcting codes may be configured to produce a non-zero value for a codeword with at least one error. The one or more error-correcting codes may be configured to enable differentiation between a burst error syndrome and a random error syndrome. The one or more error-correcting codes may be configured to enable differentiation of a number of burst error syndromes. The one or more error-correcting codes may be configured to enable differentiation between an odd burst syndrome and a single-bit error syndrome. The one or more error-correcting codes may be configured to enable differentiation between an even burst syndrome and a double-bit error syndrome.

In embodiments, the apparatus may be a memory controller.

In embodiments, the apparatus may be a microprocessor having a cache memory having a number of dynamic random memory (DRAM) units; a memory controller having the one or more error detection modules and the one or more error correction modules, coupled with the cache memory; and one or more processor cores coupled with the cache memory controller.

In embodiments, the number of DRAM units may be stacked. The number of DRAM units may be used as a memory-side cache.

In embodiments, the apparatus may be a computing device having a system memory and a microprocessor, coupled with the system memory, having the one or more error detection modules and the one or more error correction modules. The apparatus may be a computing device selected from a laptop, a netbook, a notebook, an ultrabook®, a smartphone, a tablet, a personal digital assistant, an ultra mobile PC, a mobile phone, a desktop computer, a server, a printer, a scanner, a monitor, a set-top box, an entertainment control unit, a digital camera, a digital music player, or a digital video recorder.

In embodiments, one or more non-transient machine readable storage medium having a number of instructions may be configured to enable a controller, in response to execution of the number of instructions by the controller, to detect for presence of errors of a number of error types in a codeword having a data portion and associated check bits, using one or more error-correcting codes; and correct errors of the number of error types, on detection of the errors.

In embodiments, the number of instructions may be configured to enable the controller, in response to execution of the number of instructions by the controller, to calculate a first syndrome for the codeword, using the one or more error-correcting codes; and calculate a second syndrome, based at least in part on the first syndrome. The first syndrome may enable detection of presence of one or more errors of at least a first error type of the codeword, and the second syndrome may enable detection of presence of one or more errors of at least a second error type of the codeword.

In embodiments, the number of instructions may be configured to enable the controller, in response to execution of the number of instructions by the controller, to calculate a first error mask based at least in part on the first syndrome to correct one or more errors of the first error type; and calculate a second error mask based at least in part on the second syndrome to correct one or more errors of the second error type.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. An apparatus, comprising:
    one or more error detection modules, including one or more error-correcting codes, configured to detect for presence of errors of a plurality of error types in a codeword having a data portion and associated check bits, using the one or more error-correcting codes, wherein at least one error detection module of the one or more error detection modules comprises a first syndrome calculation module, having at least one of the one or more error-correcting codes, configured to calculate a first syndrome based at least in part on the codeword, using the at least one error-correcting code; and a second syndrome calculation module, coupled with the first syndrome calculation module, configured to calculate a second syndrome that is normalized based at least in part on the first syndrome; and
    one or more error correction modules coupled with the one or more error detection modules, and configured to correct errors of the plurality of error types based on a common syndrome, on detection by the one or more error detection modules.

2. The apparatus according to claim 1,
    wherein the first syndrome enables detection of errors of a first error type of the plurality of error types, and the second syndrome enables detection of errors of a second error type of the plurality of error types.

3. The apparatus according to claim 2, wherein the one or more error detection modules, further comprises:
    an error type classification module coupled with the second syndrome calculation module, and configured to classify one or more error subtypes of the first error type based at least in part on the first syndrome and one or more error subtypes of the second error type based at least in part on the second syndrome.

4. The apparatus according to claim 2, wherein the one or more error correction modules, comprises:
    a multiplex module coupled with at least one of the one or more error detection modules, and configured to selectively output the first syndrome or the second syndrome; and
    an error mask calculation module coupled with the multiplex module, and configured to calculate a first error mask when the multiplex module selectively output the second syndrome as the common syndrome.

5. The apparatus according to claim 4, wherein the one or more error correction modules, further comprises:
    a burst error repeater module coupled with the error mask calculation module, and configured to supplement a plurality of missing error bits to the first error mask to form a second error mask; and
    an error corrector module coupled with the burst error repeater module, and configured to correct the errors of the plurality of error types in the codeword by applying the second error mask to the codeword.

6. The apparatus according to claim 4, wherein the multiplex module is configured to select the first syndrome or the second syndrome based at least in part on information received from the error type classification module.

7. The apparatus according to claim 1, wherein the one or more error-correcting codes are configured to produce a non-zero value for a codeword with at least one error.

8. The apparatus according to claim 7, wherein the one or more error-correcting codes are configured to enable differentiation between a burst error syndrome and a random error syndrome.

9. The apparatus according to claim 8, wherein the one or more error-correcting codes are configured to enable differentiation of a plurality of burst error syndromes.

10. The apparatus according to claim 9, wherein the one or more error-correcting codes are configured to enable differentiation between an odd burst syndrome and a single-bit error syndrome.

11. The apparatus according to claim 10, wherein the one or more error-correcting codes are configured to enable differentiation between an even burst syndrome and a double-bit error syndrome.

12. The apparatus according to claim 1, wherein the apparatus is a memory controller.

13. The apparatus according to claim 1, wherein the apparatus is a microprocessor comprising:
    a cache memory having a plurality of dynamic random memory (DRAM) units;
    a memory controller having the one or more error detection modules and the one or more error correction modules, coupled with the cache memory; and
    one or more processor cores coupled with the cache memory controller.

14. The apparatus according to claim 13, wherein the plurality of DRAM units are stacked.

15. The apparatus according to claim 14, wherein the plurality of DRAM units are used as a memory-side cache.

16. The apparatus according to claim 1, wherein the apparatus is a computing device, comprising:
    a system memory; and
    a microprocessor, coupled with the system memory, having the one or more error detection modules and the one or more error correction modules.

17. The apparatus according to claim 16, wherein the computing device is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a digital music player, or a digital video recorder.

18. One or more non-transient machine readable storage medium having a plurality of instructions configured to enable a controller, in response to execution of the plurality of instructions by the controller, to:
    detect for presence of errors of a plurality of error types in a codeword having a data portion and associated check bits, using one or more error-correcting codes;

calculate a first syndrome for the codeword, using the one or more error-correcting codes;

calculate a second syndrome, based at least in part on the first syndrome; and correct the errors of the plurality of error types based on a common syndrome, on detection of the errors.

19. The one or more non-transient machine readable storage medium according to claim 18, wherein the first syndrome enables detection of presence of one or more errors of at least a first error type of the codeword, and the second syndrome enables detection of presence of one or more errors of at least a second error type of the codeword.

20. The one or more non-transient machine readable storage medium according to claim 19, wherein the plurality of instructions are configured to enable the controller, in response to execution of the plurality of instructions by the controller, to:

calculate a first error mask based at least in part on the first syndrome to correct one or more errors of the first error type; and calculate a second error mask based at least in part on the second syndrome to correct the errors of the plurality of error types, wherein the second syndrome is the common syndrome.

21. A method, comprising:

detecting, by a controller, for presence of errors of a plurality of error types in a codeword having a data portion and associated check bits, using an error-correcting code;

calculating, by the controller, a first syndrome for the codeword, using the error-correcting code;

calculating, by the controller, a second syndrome, based at least in part on the first syndrome; and correcting, by the controller, the errors of the plurality of error types based on a common syndrome, on detection of the errors.

22. The method of claim 21, wherein the first syndrome enables detection of presence of one or more errors of at least a first error type in the codeword, and the second syndrome enables detection of presence of one or more errors of at least a second error type in the codeword.

23. The method of claim 22, wherein correcting comprises calculating, by the controller, a first error mask based at least in part on the first syndrome to correct one or more errors of the first error type; and calculating, by the controller, a second error mask based at least in part on the second syndrome to correct the errors of the plurality of error types, wherein the second syndrome is the common syndrome.

24. The method of claim 21, wherein the plurality of error types comprises a random error type and a burst error type.

* * * * *